United States Patent
Hong et al.

(10) Patent No.: US 12,387,874 B2
(45) Date of Patent: Aug. 12, 2025

(54) DUAL SHIELDING STRUCTURE OF COILS DISPOSED IN WEARABLE ELECTRONIC DEVICE

(71) Applicant: SAMSUNG ELECTRONICS CO., LTD., Suwon-si (KR)

(72) Inventors: Jongchul Hong, Suwon-si (KR); Jungsu Park, Suwon-si (KR); Yongsang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 872 days.

(21) Appl. No.: 17/554,409

(22) Filed: Dec. 17, 2021

(65) Prior Publication Data

US 2022/0108833 A1 Apr. 7, 2022

Related U.S. Application Data

(63) Continuation of application No. PCT/KR2021/010124, filed on Aug. 3, 2021.

(30) Foreign Application Priority Data

Aug. 4, 2020 (KR) .......................... 10-2020-0097445

(51) Int. Cl.
  *H01F 27/28* (2006.01)
  *G04C 10/02* (2006.01)
  (Continued)

(52) U.S. Cl.
  CPC ......... *H01F 27/2885* (2013.01); *G04C 10/02* (2013.01); *G04G 17/04* (2013.01);
  (Continued)

(58) Field of Classification Search
  CPC .... H01F 27/2885; H01F 27/366; H01F 38/14; H02J 50/10; H02J 50/005; H02J 50/70;
  (Continued)

(56) References Cited

U.S. PATENT DOCUMENTS 8,421,574 B2 * 4/2013 Suzuki .................... H01F 38/14
  336/200
9,130,395 B2 * 9/2015 Jung ....................... H02J 50/70
  (Continued)

FOREIGN PATENT DOCUMENTS

KR 10-2016-0063844 6/2016
KR 10-2016-0084278 7/2016
  (Continued)

OTHER PUBLICATIONS

Korean Office Action dated Mar. 11, 2025 for KR Application No. 10-2020-0097445.

*Primary Examiner* — Allen L Parker
*Assistant Examiner* — Martin Antonio Asmat Uceda
(74) *Attorney, Agent, or Firm* — Nixon & Vanderhye P.C.

(57) ABSTRACT

A wearable electronic device may include: a display, a housing forming at least part of an exterior of the wearable electronic device, a printed circuit board disposed beneath the display, a plurality of electronic components disposed on the printed circuit board, a rear cover forming at least a part of a rear surface of the wearable electronic device, a conductive coil disposed within a specified proximity of the rear cover, a first electromagnetic shield disposed between the conductive coil and the plurality of the electronic components, and configured to shield a first area covering the conductive coil, and a second electromagnetic shield disposed between the first electromagnetic shield and the plurality of the electronic components, and configured to shield at least an area outside of the first area.

19 Claims, 10 Drawing Sheets

(51) Int. Cl.

| | | |
|---|---|---|
| *G04G 17/04* | (2006.01) | |
| *G06F 1/16* | (2006.01) | |
| *H01F 27/36* | (2006.01) | |
| *H01F 38/14* | (2006.01) | |
| *H02J 50/00* | (2016.01) | |
| *H02J 50/10* | (2016.01) | |
| *H02J 50/12* | (2016.01) | |
| *H02J 50/70* | (2016.01) | |
| *H05K 9/00* | (2006.01) | |

(52) U.S. Cl.
CPC ............ *G06F 1/16* (2013.01); *H01F 27/366* (2020.08); *H01F 38/14* (2013.01); *H02J 50/005* (2020.01); *H02J 50/10* (2016.02); *H02J 50/12* (2016.02); *H02J 50/70* (2016.02); *H05K 9/0024* (2013.01); *G04G 17/045* (2013.01); *G06F 1/163* (2013.01)

(58) Field of Classification Search
CPC ........ H02J 50/12; H05K 9/0024; G06F 1/163; G06F 1/16; G04C 10/02; G04G 17/04; G04G 17/045
See application file for complete search history.

(56) References Cited

U.S. PATENT DOCUMENTS

| | | | |
|---|---|---|---|
| 9,583,256 B2 * | 2/2017 | Lapetina | H01F 27/36 |
| 9,672,976 B2 * | 6/2017 | Levo | H01F 27/366 |
| 9,685,690 B2 * | 6/2017 | Samardzija | H01Q 1/52 |
| 10,084,328 B2 * | 9/2018 | You | H02J 50/80 |
| 10,485,478 B1 * | 11/2019 | Mirov | A61B 5/14551 |
| 10,682,094 B2 * | 6/2020 | Kim | G04G 21/02 |
| 10,910,862 B2 * | 2/2021 | Elkayam | H01F 38/14 |
| 11,456,614 B2 * | 9/2022 | An | H02J 50/20 |
| 12,003,113 B2 * | 6/2024 | Jia | H02J 50/90 |
| 2013/0285605 A1 * | 10/2013 | Partovi | H04B 5/266 |
| | | | 320/108 |
| 2015/0170829 A1 * | 6/2015 | Waffenschmidt | H02J 50/10 |
| | | | 320/108 |
| 2015/0311960 A1 | 10/2015 | Samardzija et al. | |
| 2015/0364938 A1 * | 12/2015 | Lapetina | H01F 27/36 |
| | | | 320/114 |
| 2015/0371768 A1 * | 12/2015 | Graham | H01F 1/147 |
| | | | 320/108 |
| 2017/0084991 A1 * | 3/2017 | Mayo | H01F 38/14 |
| 2017/0133751 A1 * | 5/2017 | Noh | H01Q 1/38 |
| 2017/0271906 A1 | 9/2017 | Tseng et al. | |
| 2017/0358393 A1 * | 12/2017 | Jang | H01F 27/2885 |
| 2018/0054077 A1 * | 2/2018 | Brzezinski | H02J 50/90 |
| 2018/0084680 A1 * | 3/2018 | Jarvis | H05K 7/20963 |
| 2018/0248406 A1 * | 8/2018 | Bae | H02J 7/02 |
| 2018/0279517 A1 | 9/2018 | Jang et al. | |
| 2019/0006756 A1 | 1/2019 | Lee et al. | |
| 2019/0074729 A1 * | 3/2019 | Wittenberg | H02J 50/10 |
| 2019/0312451 A1 | 10/2019 | An et al. | |
| 2019/0387649 A1 | 12/2019 | Hong | |
| 2019/0388028 A1 | 12/2019 | Kim et al. | |
| 2020/0227954 A1 * | 7/2020 | Ding | H02J 50/10 |
| 2021/0194282 A1 * | 6/2021 | Jia | H02J 7/0042 |

FOREIGN PATENT DOCUMENTS

| | | |
|---|---|---|
| KR | 10-2016-0089317 | 7/2016 |
| KR | 10-2017-0137494 | 12/2017 |
| KR | 10-2019-0004103 | 1/2019 |
| KR | 10-2019-0067872 A | 6/2019 |
| KR | 10-2019-0118058 | 10/2019 |
| KR | 10-2019-0142862 | 12/2019 |

\* cited by examiner

DUAL SHIELDING STRUCTURE OF COILS DISPOSED IN WEARABLE ELECTRONIC DEVICE

CROSS-REFERENCE TO RELATED APPLICATIONS

This application is a continuation of International Application No. PCT/KR2021/010124 designating the United States and filed on Aug. 3, 2021, in the Korean Intellectual Property Receiving Office and claiming priority to Korean Patent Application No. 10-2020-0097445, filed on Aug. 4, 2020, in the Korean Intellectual Property Office, the disclosures of which are incorporated by reference herein in their entireties.

BACKGROUND

Field

The disclosure relates to a dual shielding structure for improving wireless charging performance and a wearable electronic device including the same.

Description of Related Art

A mobile electronic device which wirelessly receives energy may be driven by the received wireless power, or may charge its battery with the received wireless power and be driven by the charged power.

Such wireless charging technology, which uses a wireless power data transmission and reception technique, may automatically charge a battery merely by putting the mobile electronic device on a charging pad without connecting a separate charging connector to the mobile electronic device. This wireless charging technology wirelessly charges the electronic device, and thus enhances user's convenience.

Various electronic metal components or members are disposed in an electronic device. Hence, an electronic device using wireless charging technology includes a shielding member to reduce an electromagnetic field lost by the metal component near a wireless charging coil.

In a small electronic device such as a wearable electronic device, conventional art may include a minimum shielding area based on an outside diameter and an inside diameter of the wireless charging coil due to limitation of a mounting structure, and accordingly efficient wireless charging efficiency may not be attained.

SUMMARY

Embodiments of the disclosure address the above-stated problem by providing a wearable electronic device having a dual shielding structure including a second shielding member for shielding an outside area of an area shielded by a conventional shielding member.

A wearable electronic device according to an example embodiment may include: a display, a housing forming at least part of an exterior of the wearable electronic device, a printed circuit board disposed beneath the display, a plurality of electronic components disposed beneath the printed circuit board, a rear cover forming at least a part of a rear surface of the wearable electronic device, a conductive coil disposed within a specified proximity to the rear cover, a first electromagnetic shield disposed between the conductive coil and the plurality of the electronic components, and shielding a first area covering conductive coil, and a second electromagnetic shield disposed between the first electromagnetic shield and the plurality of the electronic components, and shielding at least an outside area of the first area.

A wearable electronic device according to an example embodiment may include: a housing forming at least part of an exterior of the wearable electronic device, a battery disposed in an inner space formed by the housing, a printed circuit board disposed beneath the battery, a plurality of electronic components disposed beneath the printed circuit board, a rear cover forming at least a part of a rear surface of the wearable electronic device, a wireless charging coil electrically connected with the battery and disposed within a specified proximity of the rear cover, a first electromagnetic shield disposed between the wireless charging coil and the plurality of the electronic components, and shielding a first area covering the wireless charging coil, and a second electromagnetic shield disposed between the first shielding member and the plurality of the electronic components, and shielding a second area different from the first area.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

Throughout the drawings, like reference numerals will be understood to refer to like parts, components and structures.

DETAILED DESCRIPTION

Figure 1:
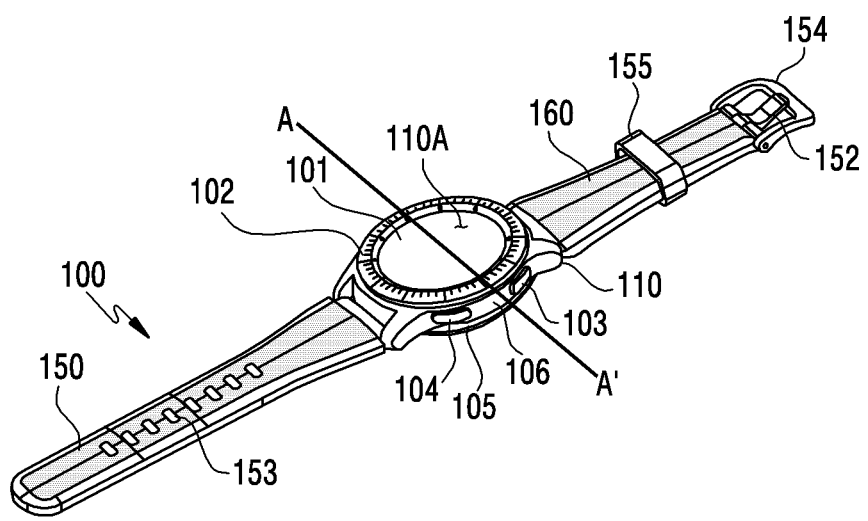
FIG. 1 is a front perspective view of an example mobile electronic device according to various embodiments.

Hereinafter, various example embodiments of the disclosure will be described in greater detail with reference to the accompanying drawings. For convenience of descriptions, the components illustrated in the drawings may be exaggerated or reduced in size, and the disclosure is not necessarily limited to the illustrated ones.

The electronic device according to various example embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
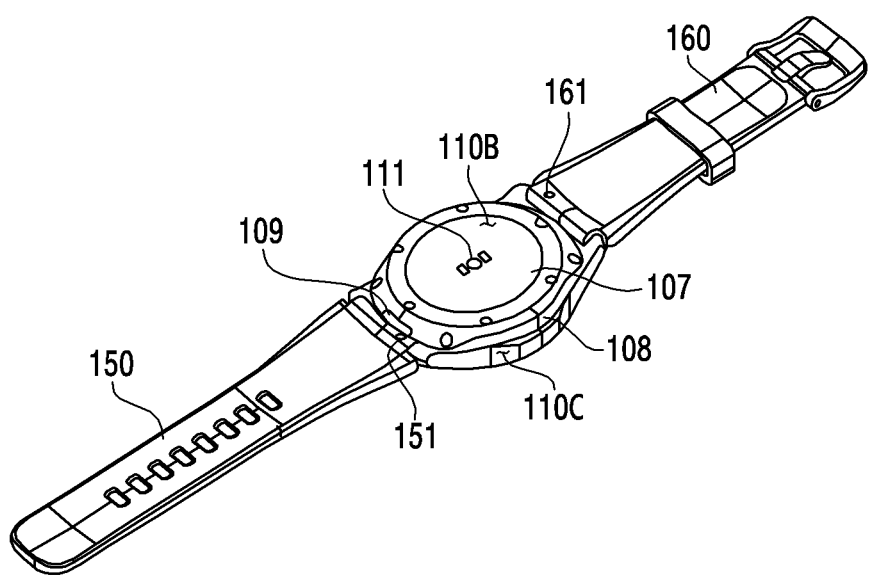
FIG. 2 is a rear perspective view of the electronic device of FIG. 1 according to various embodiments.
Figure 3:
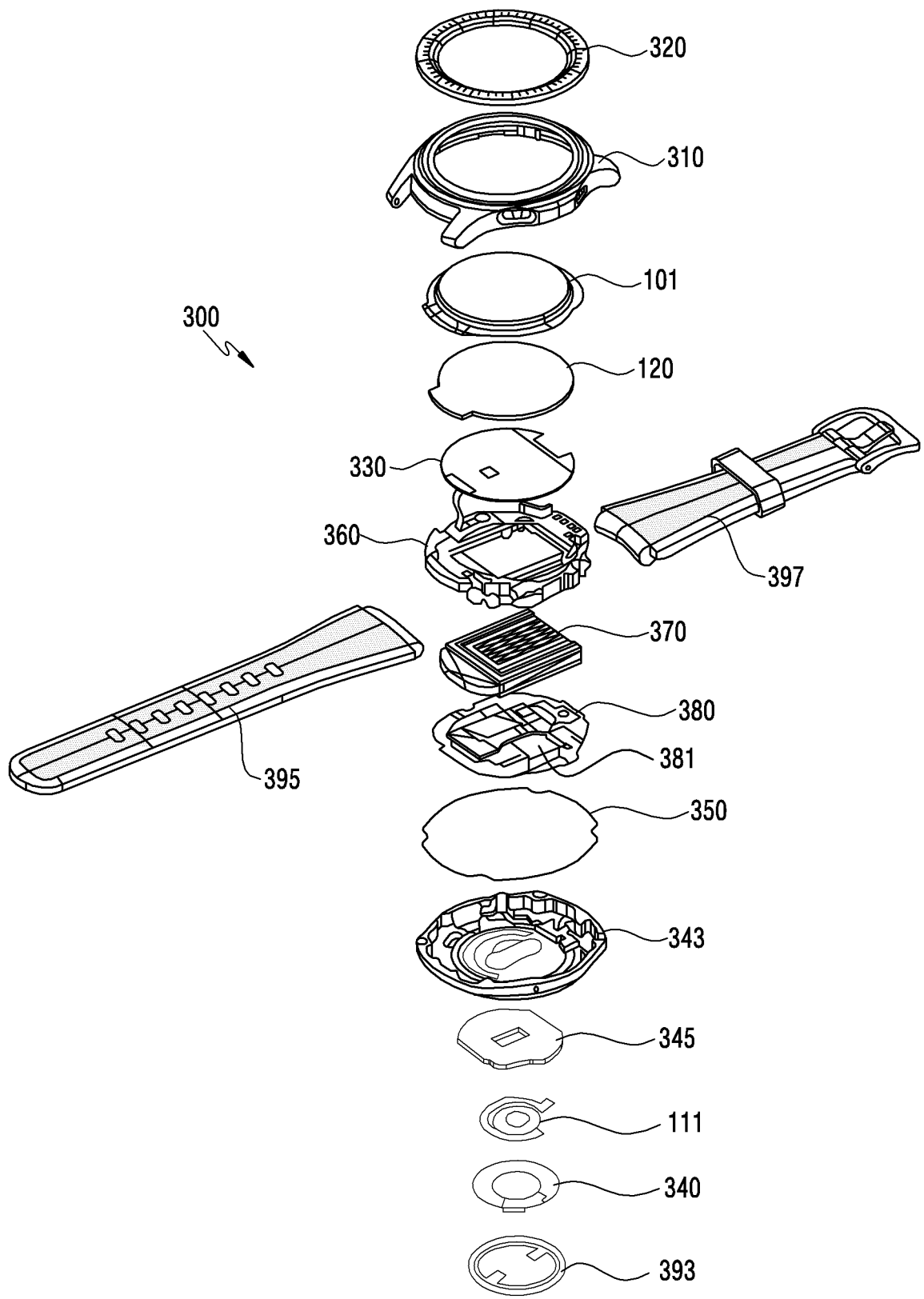
FIG. 3 is an exploded perspective view of the electronic device of FIG. 1 according to various embodiments.

FIG. 1 is a front perspective view of a mobile electronic device (e.g., a wearable electronic device) according to various embodiments, FIG. 2 is a rear perspective view of the electronic device of FIG. 1 according to various embodiments, and FIG. 3 is an exploded perspective view of the electronic device of FIG. 1 according to various embodiments.

Referring to FIG. 1 and FIG. 2, an electronic device 100 according to an embodiment may include a housing 110 which includes a first surface (e.g., a front surface) 110A, a second surface (e.g., a rear surface) 110B, and a side surface 110C surrounding a space between the first surface 110A and the second surface 110B, and fastening members (e.g., a strap) 150 and 160 connected to at least a part of the housing 110 and detachably fastening the electronic device 100 to a user's body part (e.g., a wrist, an ankle, etc.). In an embodiment (not shown), the housing may refer, for example, to a structure which forms part of the first surface 110A, the second surface 110B and the side surface 110C of FIG. 1. According to an embodiment, the first surface 110A may be formed by a front plate 101 (e.g., a glass plate including various coating layers, or a polymer plate) which is at least in part substantially transparent. The second surface 110B may be formed by a rear plate 107 which may be substantially opaque. The rear plate 107 may be formed by, for example, coated or colored glass, ceramic, polymer, metal (e.g., aluminum, stainless steel (STS), or magnesium), or a combination of at least two of the above materials. The side surface 110C may be formed by a side bezel structure (e.g., a side member) 106 which couples the front plate 101 and the rear plate 107, and may include a metal and/or a polymer. In various embodiments, the rear plate 107 and the side bezel structure 106 may be integrally formed and include the same material (e.g., a metal material such as aluminum). The fastening members 150 and 160 may be formed of various materials in various shapes. An integral link or a plurality of unit links may be formed to move with respect to each other using, for example, and without limitation, fabric, leather, rubber, urethane, metal, ceramic, or a combination of at least two of them.

According to an embodiment, the electronic device 100 may include at least one or more of a display 120 (see FIG. 3), audio modules (e.g., including audio circuitry) 105 and 108, a sensor module (e.g., including at least one sensor) 111, key input devices 102, 103 and 104 and a connector hole 109. In various embodiments, the electronic device 100 may exclude at least one (e.g., the key input devices 102, 103 and 104, the connector hole 109, or the sensor module 111) of the components or may further include other component.

The display 120 may be visible through, for example, a considerable portion of the front plate 101. The display 120 may have a shape corresponding to a shape of the front plate 101, in various shapes such as a circle, an ellipse, or a polygon. The display 120 may be coupled with or disposed close to a touch detection circuit, a pressure sensor for measuring a touch level (pressure), and/or a fingerprint sensor.

The audio modules 105 and 108 may include a microphone hole 105 and a speaker hole 108. The microphone hole 105 may include a microphone therein to acquire an external sound, and may include a plurality of microphones therein to detect a direction of a sound in various embodiments. The speaker hole 108 may be used as an external speaker and a telephone call receiver. In various embodiments, the speaker holes 108 and the microphone hole 105 may be implemented as a single hole, or a speaker (e.g., a piezoelectric speaker) may be included without the speaker holes 108.

The sensor module 111 may include at least one sensor and generate an electric signal or a data value corresponding to an internal operating state or an external environment state of the electronic device 100. The sensor module 111 may include, for example, and without limitation, a biometric sensor module (e.g., a heart rate monitor (HRM) sensor) disposed on the second surface 110B of the housing 110. The electronic device 100 may further include a sensor module not shown, including for example, and without limitation, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, a luminance sensor, or the like.

The key input devices 102, 103, and 104 may include a wheel key 102 disposed on the first surface 110A of the housing 110 and rotating in at least one direction, and/or side key buttons 103 and 104 disposed on the side surface 110C of the housing 110. The wheel key 102 may have a shape corresponding to the shape of the front plate 101. In an embodiment, the electronic device 100 may not include some or all of the above-mentioned key input devices 102, 103, and 104, and the key input devices 102, 103, and 104 not included may be implemented on the display 120 in other type such as soft keys. The connector hole 109 may include another connector hole (not shown) which receives a connector (e.g., a universal serial bus (USB) connector) for transmitting and receiving power and/or data to and from an external electronic device, and receives a connector for transmitting and receiving an audio signal to and from the external electronic device. The electronic device 100 may further include, for example, a connector cover (not shown) for covering at least part of the connector hole 109 and blocking inflow of an external foreign substance into the connector hole.

The fastening members 150 and 160 may be detachably fastened in at least some area of the housing 110 using locking members 151 and 161. The fastening members 150 and 160 may include one or more of a fixing member 152, a fixing member engaging hole 153, a band guide member 154, and a band fixing ring 155.

The fixing member 152 may be configured to fix the housing 110 and the fastening members 150 and 160 to the user's body part (e.g., a wrist or an ankle). The fixing member engaging hole 153 may correspond to the fixing member 152 and secure the housing 110 and the fastening members 150 and 160 to the user's body part. The band guide member 154 may be configured to limit a movement range of the fixing member 152 if the fixing member 152 is engaged with the fixing member engaging hole 153, and thus closely fasten the fastening members 150 and 160 to the user's body part. The band fixing ring 155 may limit the movement range of the fastening members 150 and 160, while the fixing member 152 and the fixing member fastening hole 153 are engaged.

Referring to FIG. 3, a wearable electronic device 300 may include a side bezel structure (e.g., a bezel) 310, a wheel key 320, a front plate 101, a display 120, a first antenna 330, a conductive coil 340, a sensor module (e.g., including a sensor) 111, a first shielding member (e.g., including a magnetic or metallic sheet or plate) 345, a rear plate 343, a second shielding member (e.g., including a magnetic or metallic sheet or plate) 350, a support member 360 (e.g., a bracket), a battery 370, a printed circuit board (PCB) 380, a rear cover 393, and fastening members 395 and 397 (e.g., a strap). At least one of the components of the wearable electronic device 300 may be identical or similar to at least one of the components of the electronic device 100 of FIG. 1 or FIG. 2, and redundant descriptions thereof may not be repeated here.

The support member 360 according to an embodiment may include a bracket and be disposed inside the wearable electronic device 300. For example, the support member 360 may be positioned inside the side bezel structure 310. The support member 360 may be connected to the side bezel structure 310, or may be integrated with the side bezel structure 310. The support member 360 may be formed of, for example, a metal material and/or a nonmetal material (e.g., a polymer). The support member 360 may be coupled with the display 120 in one surface and coupled with the PCB 380 in the other surface.

According to an embodiment, the PCB 380 may be a plastic board formed with at least one of polyimide, polymethylmethacrylate, polyamide, polypropylene and polyurethane. A plurality of electronic components 381 such as, for example, and without limitation, a processor, a memory, an interface, etc. may be mounted on the PCB 380.

The processor may include various processing circuitry, such as, for example, and without limitation, at least one of a central processing unit, an application processor, a graphic processing unit (GPU), an application processor sensor processor, a communication processor, or the like.

The memory may include, for example, a volatile memory or a nonvolatile memory. The interface may include, for example, a high definition multimedia interface (HDMI), a USB interface, a secure digital (SD) card interface, and/or an audio interface. The interface may electrically or physically connect, for example, the wearable electronic device 300 with an external electronic device, and may include a USB connector, an SD card/MMC connector, or an audio connector.

The battery 370 may include a device for supplying power to at least one component of the wearable electronic device 300, and may include, for example, a secondary battery which is rechargeable. At least part of the battery 370 may be substantially flush with, for example, the PCB 380. The battery 370 may be integrally disposed inside the wearable electronic device 300, and may be attached to and/or detached from the wearable electronic device 100.

The first antenna 330 may be interposed between the display 120 and the support member 360. The first antenna 330 may include, for example, and without limitation, a near field communication (NFC) antenna, a wireless charging antenna, and/or a magnetic secure transmission (MST) antenna, or the like. The first antenna 330 may, for example, perform short-range communication with an external device or wirelessly transmit and receive power for the charging, and transmit a magnetic-based signal including a short-range communication signal or payment data. In an embodiment, an antenna structure may be formed by part or a combination of the side surface bezel structure 310 and/or the support member 360.

The sensor module 111 may include at least one sensor and generate data corresponding to the internal state or the external environment state of the electronic device 300, as an electric signal value. For example, the sensor module 111 may include, for example, and without limitation, a biometric sensor (e.g., an HRM sensor, a photoplethysmogram (PPG) sensor), and may further include, for example, and without limitation, at least one of a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, a luminance sensor, or the like.

The conductive coil 340 may be interposed between the PCB 380 and the rear cover 393. The conductive coil 340 may be, for example, a wireless charging coil and/or a coil antenna. The conductive coil 340 may, for example, wirelessly transmit and receive the power for the charging, perform short-range communication with an external device, or transmit a magnetic-based signal including a short-range communication signal or payment data.

The conductive coil 340 may be wound by increasing its winding radius on a plane (e.g., the PCB). For example, the conductive coil 340 may be configured in a conductive pattern wound in a spiral shape with a first inside diameter and a second outside diameter which is greater than the first inside diameter. According to an embodiment, the conductive coil 340 may wirelessly receive the power from a wireless power transmitting device. For example, if an electromagnetic field is applied to the conductive coil 340, an electric current may flow through the conductive coil 340 according to magnetic induction and the battery 370 may be charged using the induced current. According to an embodiment, the conductive coil 340 may be disposed close to a lower surface of the wearable electronic device 300 or the rear cover 393.

The first shielding member 345 (the first and second shielding members may be referred to as first and second electromagnetic shields, respectively, and may include, for example, and without limitation, an electromagnetic shielding material in the form of a sheet or plate) may be interposed between the conductive coil 340 and the PCB 380, and shield an area covered by the conductive coil 340. According to an embodiment, the first shielding member 345 may shield (or cover) the whole area occupied by the conductive coil 340, when viewed vertically from above the wearable electronic device 300. The second shielding member 350 may be interposed between the first shielding member 345 and the PCB 380, and shield outside of the area where at least the first shielding member 345 covers the conductive coil 345. According to an embodiment, the second shielding member 350 may shield (or cover) at least the outside area of the area occupied by the first shielding member 345, when viewed vertically from above the wearable electronic device 300. For example, the second shielding member 350 may be disposed to cover at least an area not covered by the first shielding member 345, when viewed vertically from above the wearable electronic device 300.

According to an embodiment, the first shielding member 345 and the second shielding member 350 may dually shield an electromagnetic field leaked by a metal component of the electronic components 381.

According to an embodiment, the first shielding member 345 and/or the second shielding member 350 may prevent and/or reduce malfunctions or damages of the electronic components 381 caused by the electromagnetic field from an external electronic device. For example, if the electromagnetic field from the external electronic device may be exerted to an electronic component (or a metal material) in the wearable electronic device 300, electromotive force may be produced by a varying magnetic flux and an eddy current generated by the electromotive force may cause not only power loss in the wireless power reception but also malfunction or temperature rise of the electronic component. According to an embodiment, the first shielding member 345 and/or the second shielding member 350 may mitigate such a problem by preventing and/or reducing the eddy current.

The first shielding member 345 and/or the second shielding member 350 may include, for example, and without limitation, a magnetic sheet including a magnetic body, and the magnetic body may include, for example, and without limitation, at least one of an amorphous ribbon, a nanocrystalline ribbon, a ferrite, a polymer, or the like. According to an embodiment, the magnetic body may include an amorphous ribbon and/or a polymer. According to an embodiment, the magnetic body may include one of those materials as a single material, or combine two or more materials. According to an embodiment, the magnetic body may include, for example, and without limitation, a composite by mixing those materials with an insulating resin, a ceramic or a nonmagnetic metal and molding using a method such as extrusion, press, film casting.

The materials (e.g., an amorphous ribbon, a nanocrystalline ribbon, a ferrite, a polymer) that may be used as the magnetic body may include a magnetic material having a magnetization direction that easily responds according to a phase change of an external alternating magnetic field, and may build a magnetic circuit having highly dense magnetic flux by drawing a magnetic field distributed in space into the material. The magnetic permeability of the magnetic material, which is an index indicative of a degree of raising the magnetic flux, and the leakage magnetic field may be minimized and/or reduced by drawing the magnetic field distributed around the material into the material by use of, for example, a soft magnetism material having a high magnetic permeability. For example, the first shielding member 345 and the second shielding member 350 may shield the electromagnetic field of a frequency band in a range of about 10 kHz through 300 kHz.

A shield member (not shown) may be interposed between the side bezel structure 310 and the rear plate 343. According to an embodiment, the shield member (not shown) may be configured to block moisture and foreign substance introduced from outside to the space surrounded by the side bezel structure 310 and the rear plate 343. According to an embodiment, the shield member (not shown) may refer to a shield can mounted on the PCB 380, and may be disposed beneath the PCB 380. According to an embodiment, the shield member (not shown) may be a metallic plate member for protecting the PCB 380 and the electronic components 381 disposed on the PCB 380. For example, the shield member (not shown) may block the electromagnetic field applied to the PCB 380 and the electronic components 381 disposed on the PCB 380, and prevent and/or reduce the electronic components 381 disposed on the PCB 380 from being damaged by the electromagnetic field, the moisture, and/or the foreign substance.

In the wearable electronic device 300, the arrangement order of the side bezel structure 310, the wheel key 320, the front plate 101, the display 120, the first antenna 330, the conductive coil 340, the first shielding member 345, the second shielding member 350, the support member 360 (e.g., a bracket), the battery 370, the PCB 380, the shield member (not show), and the rear cover 393 is not limited to FIG. 3, and may change.

Figure 4A:
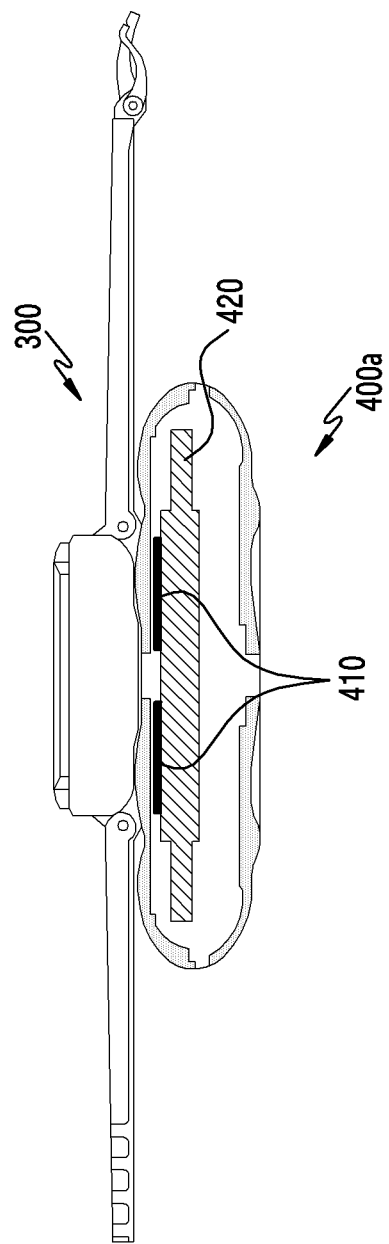
FIG. 4A is a sectional view illustrating a wearable electronic device on a wireless power transmitting device (e.g., a wireless charger) according to various embodiments.

FIG. 4A is a cross-sectional view of a wearable electronic device 300 (e.g., a smart watch) on a wireless power transmitting device (e.g., a wireless charger 400a) according to various embodiments.

Referring to FIG. 4A, the wireless charger 400a according to an embodiment may function as the wireless power transmitting device, and the wearable electronic device 300 may function as a wireless power receiving device. For example, the wireless charger 400a may wirelessly transmit power to the wearable electronic device 300 placed on the wireless charger 400a. The wireless charger 400a according to an embodiment may be directly connected to an external power source through a travel adaptor (TA) which is commonly used, receive the power from the external power source, and charge a battery (not shown) disposed therein.

According to an embodiment, the wireless power transmitting device may support at least one wireless power transmission scheme of, for example, and without limitation, an electromagnetic induction scheme, an electromagnetic resonance scheme, an RF wireless power transmission scheme, or the like. According to an embodiment, the wireless power transmitting device may adaptively determine the wireless power transmission scheme for the corresponding wireless power receiving device based on a type, a state or a required power of the wireless power receiving device.

According to an embodiment, the wireless power transmission scheme of the wireless power transmitting device may use a wireless power transmission standard based on the electromagnetic induction scheme using the electromagnetic induction principle in which an electromagnetic field is generated at the wireless charging coil and electricity is induced in a receiver coil by the electromagnetic field.

According to an embodiment, the wireless charger 400a may include a housing (not shown), a wireless charging transmission coil 410, a PCB 420, and a battery (not shown). According to an embodiment, a wireless charging circuit (not shown), a charger IC (not shown), a wireless communication module (not shown) and/or a processor (not shown) may be mounted on the PCB 420.

According to an embodiment, the wireless charging transmission coil 410 may be configured in a conductive pattern wound in, for example, a spiral shape. The wireless charging transmission coil 410 may, for example, wirelessly transmit the power to the wearable electronic device 300. The wireless charging transmission coil 410 may generate a magnetic field for inducing currents to a receiver coil (e.g., the conductive coil 340) of the wearable electronic device 300 using, for example, external power or currents applied from the battery. According to an embodiment, the wireless charging transmission coil 410 may disposed close to an upper surface of the wireless charger 400a.

According to an embodiment, the wireless charging circuit may convert the electric energy to a power signal through the wireless charging transmission coil 410 and transmit the power signal to the wearable electronic device 300. The wireless charging circuit may support at least one or more of various wireless charging schemes including, for example, and without limitation, a magnetic induction scheme and a magnetic resonance scheme.

According to an embodiment, the wireless charger 400a may further include a light emitting diode (LED) module (not shown) for emitting light, and the LED module may emit the light based on a battery charging state of the wireless charger 400a.

According to an embodiment, an upper surface shape of the wireless charger 400a for the wearable electronic device 300 (e.g., a smart watch) may correspond to a lower surface of the wearable electronic device 300. According to this example, a proportion of introducing the electromagnetic field generated at the wireless charger 400a to the conductive coil 340 of the wearable electronic device 300 may be increased without leakage, and wireless charging efficiency may be raised. The wearable electronic device 300 is not limited to the wireless charger 400a for the wearable electronic device 300 in the disclosure, and may be applied to various wireless power transmitting devices.

Figure 4B:
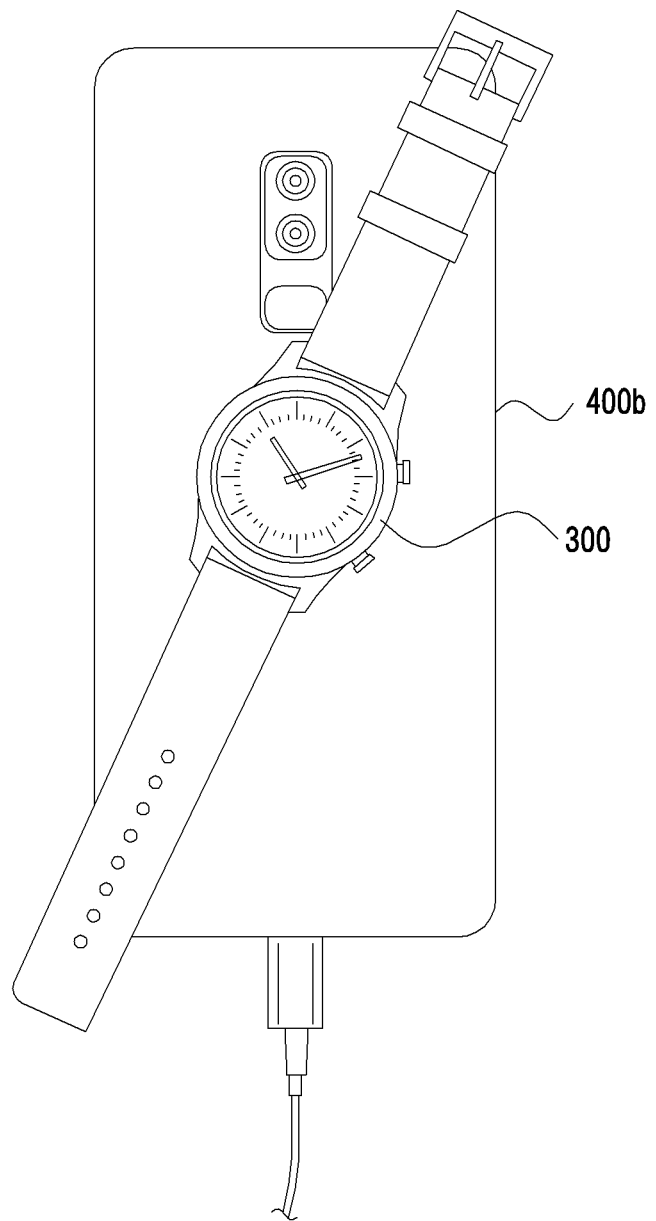
FIG. 4B is a diagram illustrating the wearable electronic device on a wireless power transmitting device (e.g., a smart phone) according to various embodiments.

FIG. 4B is a diagram illustrating the wearable electronic device 300 (e.g., a smart watch) on the wireless power transmitting device (e.g., a smart phone 400b) according to various embodiments.

Referring to FIG. 4B, the wearable electronic device 300 may be charged by wirelessly receiving the power from another electronic device, such as, for example, and without limitation, a smart phone 400b. According to an embodiment, if the smart phone 400b recognizes the wearable electronic device 300 placed on the smart phone 400b, a wireless charging transmission coil (not shown) in the smart phone 400 may generate an electromagnetic field. The electromagnetic field may be introduced to the conductive coil 340 of the wearable electronic device 300 placed on the smart phone 400b, and an induced current may generate in the conductive coil 340. Such electromagnetic induction may charge the battery 370 of the wearable electronic device 300. The smart phone 400b serving as the wireless power transmitting device in FIG. 4B may correspond to the wireless charger 400a which serves as the wireless power transmitting device in FIG. 4A, and its redundant explanation may not be repeated here.

Figure 5:
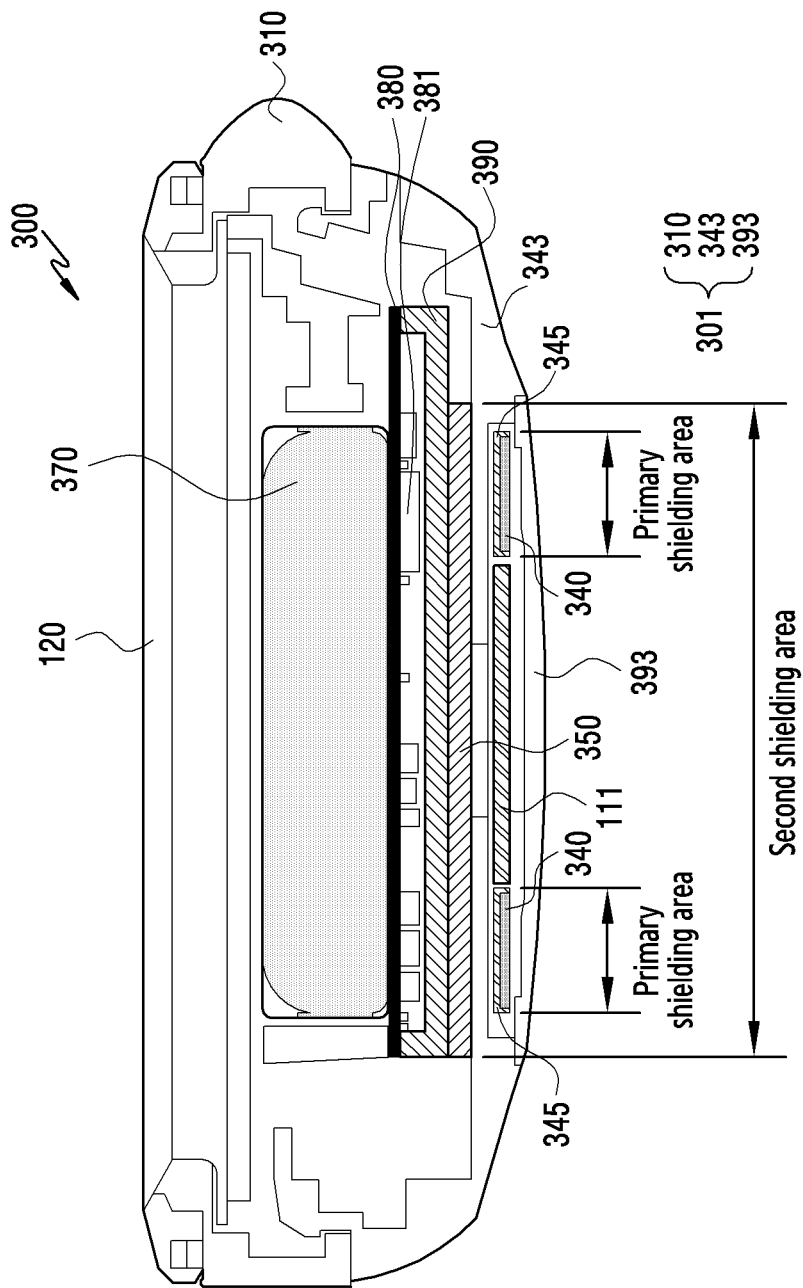
FIG. 5 is a cross-sectional view of a wearable electronic device according to various embodiments.

FIG. 5 is a cross-sectional view of a wearable electronic device 300 according to various embodiments. FIG. 5 is the cross-sectional view of the wearable electronic device 300, taken along A-A' of FIG. 1, according to various embodiments.

Referring to FIG. 5, the wearable electronic device 300 according to an embodiment may include a housing 301 which forms at least part of an exterior of the wearable electronic device 300, a side bezel structure 310, a rear plate 343, and a rear cover 393 which forms at least part of a rear surface of the wearable electronic device 300. The electronic device 300 may include a display 120 disposed in the housing 301 and forming at least part of a front surface of the wearable electronic device 300. A battery 370, a PCB 380, a plurality of electronic components 381, a shield member 390, a first shielding member 345, a second shielding member 350, a conductive coil 340, a sensor module 111 and/or the rear plate 343 may be disposed in a hollow space formed by the housing 301 (the side bezel structure 310, the rear plate 343 and/or the rear cover 393) and the display 120 of the wearable electronic device 300.

According to an embodiment, the rear plate 343 may be a support member for supporting components disposed inside or outside the wearable electronic device 300, and the conductive coil 340 and/or the sensor module 111 may be received in the rear plate 343. According to an embodiment, the rear cover 393 may form at least part of the rear surface of the exterior of the wearable electronic device 300. According to an embodiment, the rear plate 343 and the rear cover 393 may be integrated as a single member.

According to an embodiment, the conductive coil 340 may be disposed close (e.g., within a specified proximity) to the rear plate 343. The conductive coil 340 may be configured using a metal material of low resistivity, for example, copper. The conductive coil 340 according to an embodiment may wind wires (e.g., cooper wires) of small resistance on a plane (e.g., a wireless charging PCB) by increasing a winding radius. For example, the conducive coil 340 may be configured in a conductive pattern wound in a spiral shape including an inside diameter and an outside diameter which is greater than the inside diameter. According to an embodiment, the conductive coil 340 may be formed with a substrate having a spiral pattern. For example, the conductive coil 340 may be formed in a spiral pattern on a conductive layer of an FPCB.

According to an embodiment, the first shielding member 345 may be disposed close to (e.g., within a specified proximity of) an upper surface of the conductive coil 340. The first shielding member 345 may shield an area over an area covered at least by the conductive coil 340. According to an embodiment, the first shielding member 345 may be a circular metallic plate of a ring shape, and a center of the first shielding member 345 may be aligned to match a center of the conductive coil 340. The first shielding member 345 is not limited to the circular plate, and may have other shape for covering the whole upper surface of the conductive coil 340. According to an embodiment, the first shielding member 345 of the wearable electronic device 300 may shield not only the coverage area of the conductive coil 340 but also the inside diameter area of the coil. For example, the wearable electronic device 300 (or the first shielding member 345) may further include a shielding member for shielding an area covering the sensor module 111. According to an embodiment, the conductive coil 340 and the sensor module 111 may be formed as a single substrate, wherein the first shielding member 345 may be disposed on a rear surface of the substrate. According to an embodiment, the first shielding member 345 may be formed with a magnetic material of which a magnetization direction easily responds according to a phase change of an external alternating magnetic field, and the magnetic material may use, for example, at least one of an amorphous ribbon, a nanocrystalline ribbon, a ferrite, and a polymer.

According to an embodiment, the second shielding member 350 may be disposed close to (e.g., within a specified proximity of) an upper surface of the first shielding member 345. The second shielding member 350 may shield an outside of the area where at least the first shielding member 345 covers the conductive coil 340. That is, the second shielding member 350 may shield the area where the first shielding member 345 covers the conductive coil 340 and/or its outside area. According to an embodiment, the second shielding member 350 may be a whole metal plate, and a center of the second shielding member 350 may be aligned to match the center of the conductive coil 340 (or the first shielding member 345). The second shielding member 350 is not limited to the whole plate, and may include a set of small plates for covering the outside of the area where the first shielding member 345 covers the conductive coil 340.

According to an embodiment, the second shielding member 350 may be spaced from and over the first shielding member 345. For example, the plurality of the electronic components 381 may be disposed on the lower surface of the PCB 380, and the second shielding member 350 may be disposed under the electronic components 381. According to an embodiment, the shield member 390 may be disposed below the PCB 380. The shield member 390 may be disposed below the PCB 380 based on surface mount technology (SMT). The shield member 390 may be a plate-shaped member, at least one surface of the shield member 390 may be substantially flat, and the shield member 390 may cover a wider area than at least the area formed by the coil inside diameter. According to an embodiment, the second shielding member 350 may be disposed on the lower surface of the shield member 390. For example, the second shielding member 350 may be formed with a film including a shielding material, and the film may be attached to the shield member 390.

According to an embodiment, the first shielding member 345 may be disposed on the conductive coil 340, the second shielding member 350 may be disposed above the first shielding member 345, the shield member 390 and/or the electronic components 381 may be disposed above the second shielding member 350, and the PCB 380 may be disposed on the shield member 390 and/or the electronic components 381.

According to an embodiment, the battery 370 may be disposed beneath the PCB 380 (and the electronic components 381), wherein the second shielding member 350 may be disposed on a lower surface of the battery 370.

According to an embodiment, like the first shielding member 345, the second shielding member 350 may be formed with a magnetic material of which a magnetization direction easily responds according to a phase change of an external alternating magnetic field, and the magnetic material may use, for example, and without limitation, at least one of an amorphous ribbon, a nanocrystalline ribbon, a ferrite, a polymer, etc. According to an embodiment, the second shielding member 350 may dually shield an electromagnetic field leaked without being shielded by the first shielding member 345. The materials of the first shielding member 345 and the second shielding member 350 may be different or identical.

According to an embodiment, the sensor module 111 may be interposed between the rear plate 343 and the rear cover 393. For example, the sensor module 111 may include a PPG sensor. The PPG sensor may include a light emitting unit and a light receiving unit, and may further include a partition wall for blocking light leakage. According to an embodiment, the rear cover 393 may be formed with a material for transmitting the light emitting from the sensor module 111, and may have a convex shape in consideration of morphological features and/or operational principle features of the sensor module 111 (i.e., the PPG sensor). Due to the rear cover 393 in the convex shape, the wearable electronic device 300 and the wireless power transmitting device (not shown) may not be closely contacted and a gap may be generated between them, and the wireless power transmitting device (not shown) and the conductive coil 340 may not be aligned, thus lowering the wireless charging efficiency. In this case, that is, if the rear cover 393 of the wearable electronic device 300 is convex in shape, the second shielding member 350 added into the wearable electronic device 300 may expand the shielding area of the wearable electronic device 300 and build the dual shielding structure, thus improving the wireless charging efficiency and/or the charging recognition area.

According to an embodiment, the electromagnetic field shielding area of the first shielding member 345 may be referred to as a primary shielding area, and the electromagnetic field shielding area of the second shielding member 350 may be referred to as a secondary shielding area. According to an embodiment, the first shielding member 345 may cover at least the upper surface of the conductive coil 340, and may be constructed with the inside opened or closed. The inside of the first shielding member 345 is, but not limited to, opened in FIG. 5. For example, in the first shielding member 435 including the closed inside, the first shielding area may cover up to an inner area of the inside diameter of the conductive coil 340 without the opened inside. According to an embodiment, the secondary shielding area may include the whole primary shielding area and may be wider than the primary shielding area.

According to an embodiment, the plurality of the electronic components 381 (e.g., a processor, a memory, an interface) for controlling or realizing various functions of the wearable electronic device 300 may be disposed on the lower surface of the PCB 380. According to an embodiment, the plurality of the electronic components 381 may be disposed on the upper surface of the PCB 380. According to an embodiment, the PCB 380 may be an insulating card formed with a plastic, and may be a plate which builds an electronic circuit by interconnecting the plurality of the electronic components 381 with wires.

According to an embodiment, the shield member 390 may be interposed between the second shielding member 350 and the electronic components 381. The shield member 390 may be a plate-shaped member of a metallic material, and protect the PCB 380 the electronic components 381 on the PCB 380. For example, the shield member 390 may prevent and/or reduce the electronic components 381 on the PCB 380 from being damaged by the electromagnetic field, humidity, and/or a foreign substance.

According to an embodiment, the battery 370 may be interposed between the display 120 and the PCB 380, and supply power for driving the wearable electronic device 300. According to an embodiment, the battery 370 may be electrically connected with the conductive coil 340. The battery 370 may be charged with the current induced from the conductive coil 340, and supply the charged power to various electronic components (e.g., the display 120, the electronic components 381) disposed in the wearable electronic device 300.

Figure 6:
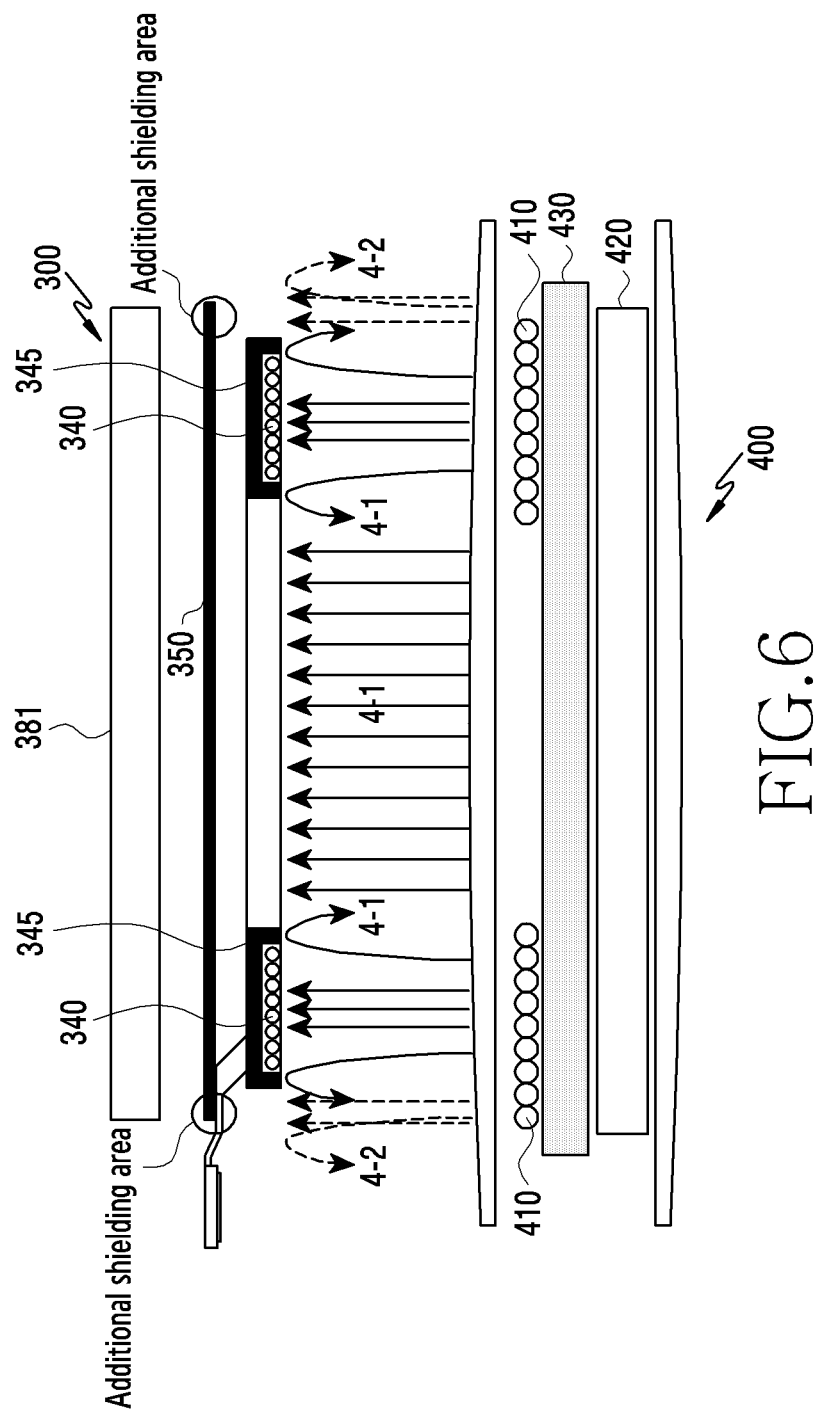
FIG. 6 is a diagram illustrating example electromagnetic fields generating at a wireless power transmitting device and a dual shielding structure of a wearable electronic device according to various embodiments.

FIG. 6 is a diagram illustrating example electromagnetic fields 4-1 and 4-2 generating at a wireless power transmitting device 400 and a dual shielding structure of a wearable electronic device 300 according to various embodiments.

Referring to FIG. 6, if the wearable electronic device 300 is positioned close to (e.g., within a specified proximity of) an upper surface of the wireless power transmitting device 400, the wearable electronic device 300 may wirelessly receive power from the wireless power transmitting device 400, and charge a battery 370 of the wearable electronic device 300. According to an embodiment, the wearable electronic device 300 may receive the power from the wireless power transmitting device 400 using, for example, and without limitation, electromagnetic induction. Charging of the wearable electronic device 300 using the electromagnetic induction is described in greater detail below.

According to an embodiment, a wireless charging transmission coil 410 (e.g., a TX coil), a PCB 420, and/or a shielding material 430 may be disposed in the wireless power transmitting device 400. According to an embodiment, the wireless charging transmission coil 410 may be disposed close to (e.g., within a specified proximity of) the upper surface of the wireless power transmitting device 400, the shielding material 430 may be disposed beneath the wireless charging transmission coil 410, and the PCB 420 may be disposed beneath the shielding material 430.

According to an embodiment, if electric currents flow the wireless charging transmission coil 410, the electromagnetic fields 4-1 and 4-2 may be generated at the wireless charging transmission coil 410 and the generated electromagnetic fields 4-1 and 4-2 may be introduced to the wearable electronic device 300 placed on the wireless power transmitting device 400. The shielding material 430 may prevent and/or reduce the generated electromagnetic fields from leaking to outside, thus increasing a proportion of the electromagnetic field 4-1 introduced to the wearable electronic device 300 and enhancing the wireless charging efficiency.

According to an embodiment, the electromagnetic field 4-1 generated at the wireless charging transmission coil 410 may be introduced to a conductive coil 340 (e.g., an RX coil) of the wearable electronic device 300. A first shielding member 345 disposed to cover an upper surface of the conductive coil 340 may prevent and/or reduce the electromagnetic field 4-1 generated at the wireless charging transmission coil 410 from being leaked by a metallic material of the wearable electronic device 300. That is, the first shielding member 345 may increase the proportion of introducing the electromagnetic field 4-1 generated at the wireless charging transmission coil 410 to the conductive coil 340, and enhance the wireless charging efficiency.

According to an embodiment, the second shielding member 350 may be disposed close to (e.g., within a specified proximity of) the upper surface of the first shielding member 345, and may further shield an area not covered by the first shielding member 345. According to an embodiment, the second shielding member 345 may further shield an outside area of the area shielded by the first shielding member 345, in addition to the area shielded by the first shielding member 345. The second shielding member 350 may dually shield the electromagnetic field to decrease the electromagnetic field 4-2 not shielded by the first shielding member 345 but leaked, that is, the electromagnetic field 4-2 affecting the outside of the conductive coil 340 among the electromagnetic fields 4-1 and 4-2 generated at the wireless charging transmission coil 410. According to an embodiment, the second shielding member 350 may increase a proportion of introducing the electromagnetic field 4-1 generated at the wireless charging transmission coil 410 to the conductive coil 340, like the first shielding member 345, and enhance the wireless charging efficiency more than the first shielding member 345 alone.

According to an embodiment, the first shielding member 345 and the second shielding member 350 may be disposed perpendicularly to the direction of the electromagnetic field applied from the wearable electronic device 300. According to an embodiment, the first shielding member 345 and the second shielding member 350 may be formed with a soft magnetism material of high permeability to draw an electromagnetic field distributed around the material into the material, and may shield the electromagnetic field in a frequency band in a range of, for example, about 10 kHz through 300 kHz. According to an embodiment, the first shielding member 345 and the second shielding member 350 may be disposed in parallel.

Figure 7:
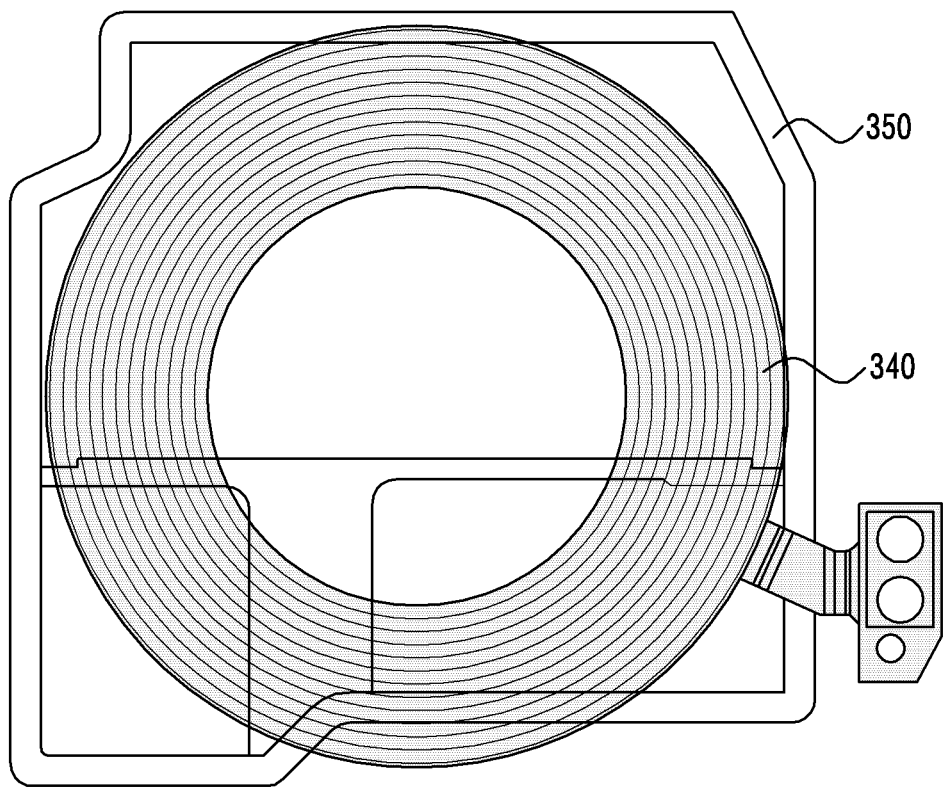
FIG. 7 is a diagram illustrating an example conductive coil and a second shielding member of a wearable electronic device according to various embodiments.

FIG. 7 is a diagram illustrating an example conductive coil 340 and a second shielding member 350 of a wearable electronic device 300 according to various embodiments.

According to an embodiment, a wireless charging transmission coil 410 of a wireless power transmitting device 400 and the conductive coil 340 of the wearable electronic device 300 may be advantageous to the wireless power transmission if their contacting surface is plane and/or their facing surface area increases. Referring to FIG. 7, the conductive coil 340 of the wearable electronic device 300 (and the wireless charging transmission coil 410 of the wireless power transmitting device 400) may have a structure which is wound by increasing a winding radius on a plane. For example, the conductive coil 340 may be in a spiral shape having an inside diameter and an outside diameter longer than the inside diameter. The winding shape of the conductive coil 340 is not limited thereto.

According to an embodiment, the second shielding member 350 may shield not only an area covered by the conductive coil 340 but also its outside area. According to an embodiment, the second shielding member 350 may be a single plate metal member for covering an inner area of the inside diameter of the conductive coil 340 wound on the plane and an outer area of the outside diameter of the conductive coil 340 wound on the plane.

According to an embodiment, the first shielding member 345 may shield not only an upper area of the area occupied by the conductive coil 340 but also the inner area of the inside diameter of the conductive coil 340. According to an embodiment, the first shielding member 345 may be disposed not only in the area covering the upper surface of the conductive coil 340 but also in the inner area of the inside diameter of the conductive coil 340.

According to an embodiment, the second shielding member 350 may be divided into a plurality of metal plate members, described in greater detail below with reference to FIG. 8 and FIG. 9.

Figure 8:
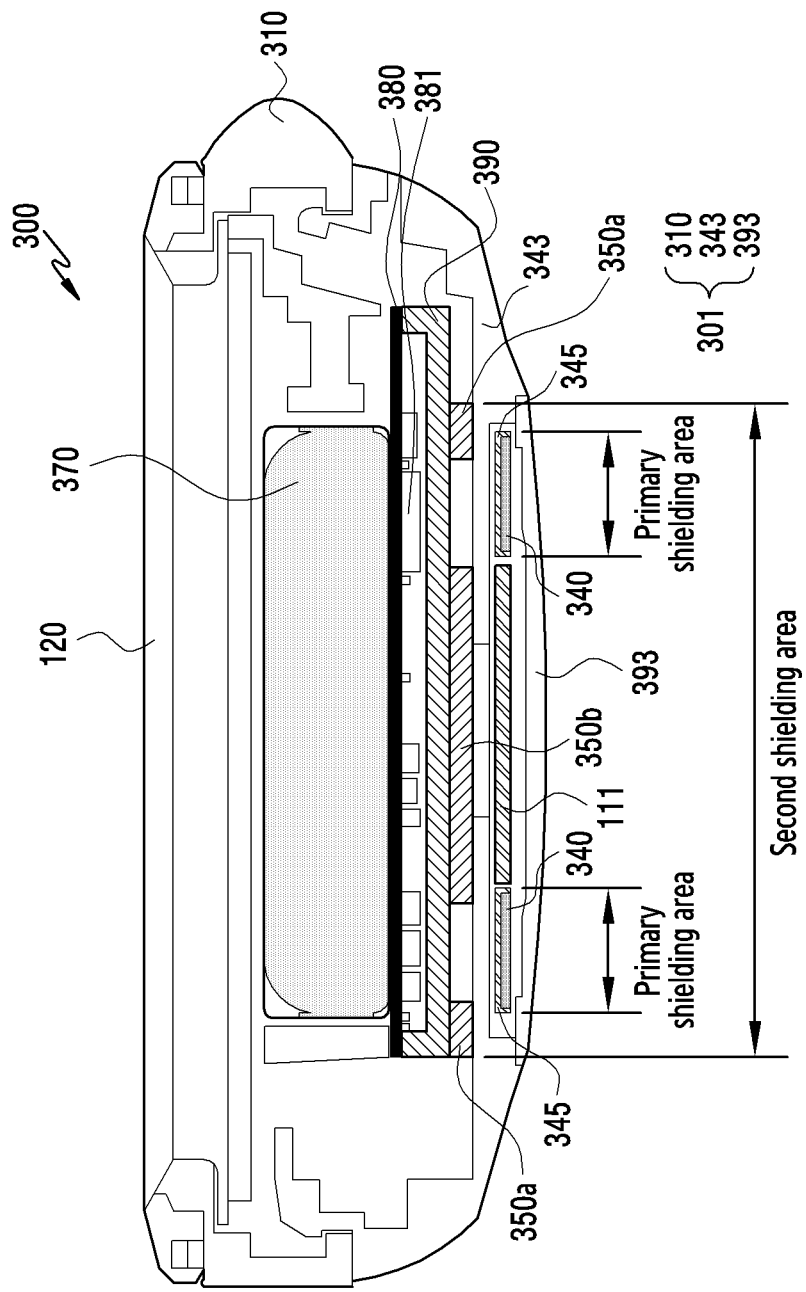
FIG. 8 is a cross-sectional view of a wearable electronic device according to various embodiments.

FIG. 8 is a cross-sectional view of a wearable electronic device 300 according to various embodiments. FIG. 8 is the cross-sectional view of an inside of the wearable electronic device 300, taken along A-A' of FIG. 1, according to various embodiments.

Referring to FIG. 8, a second shielding member 350 of the wearable electronic device 300 may include a plurality of members 350a and 350b. According to an embodiment, the second shielding member 350 may shield an outside area of an area shielded by a first shielding member 345. According to an embodiment, the second shielding member 350 may include the second shielding member 350a for shielding an outer area of an outside diameter of a conductive coil 340 wound on a plane and the second shielding member 350b for shielding an inner area of an inside diameter of the conductive coil 340 wound on the plane. According to an embodiment, the second shielding member 350a for shielding the outer area of the outside diameter of the conductive coil 340 wound on the plane may include a single member or a plurality of members. The configuration of the wearable electronic device 300 of FIG. 8 may correspond to the configuration of the wearable electronic device 300 of FIG. 5, and its redundant explanations may not be repeated here.

Figure 9:
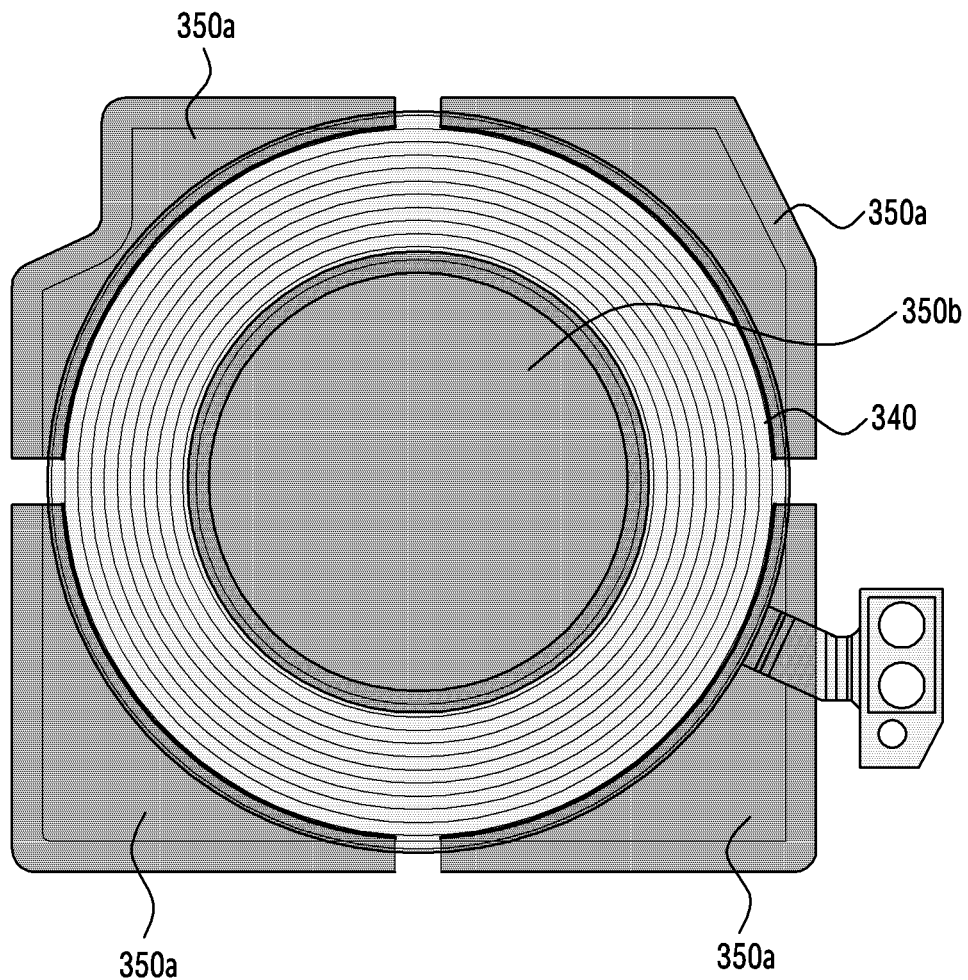
FIG. 9 is a diagram illustrating an example conductive coil and a second shielding member of a wearable electronic device according to various embodiments.

FIG. 9 is a diagram illustrating an example conductive coil 340 and a second shielding member 350 of a wearable electronic device 300 according to various embodiments.

Referring to FIG. 9, a second shielding member 350a for shielding an outer area of an outside diameter of the conductive coil 340 wound on a plane may be divided into four members. How to divide (e.g., in shape, in number) the second shielding member 350a for shielding the outer area of the outside diameter of the conductive coil 340 wound on the plane is not limited thereto. For example, the second shielding member 350a for shielding the outer area of the outside diameter of the conductive coil 340 wound on the plane may include two members divided to up and down or two members divided to left and right.

According to an embodiment, the second shielding member 350b for shielding an inner area of an inside diameter of the conductive coil 340 wound on the plane may be a single circular member. According to an embodiment, a center of the second shielding member 350b for shielding the inner area of the inside diameter of the conductive coil 340 wound on the plane may match a center of the conductive coil 340, and may have an area covering the inner area of the conductive coil 340. The shape of the second shielding member 350b for shielding the inner area of the inside diameter of the conductive coil 340 wound on the plane is not limited to the circular shape, and may have various shapes corresponding to the inner area of the inside diameter of the conductive coil 340.

A wearable electronic device (e.g., the electronic device 100 of FIG. 1, the wearable electronic device 300 of FIG. 3) according to an example embodiment may include: a display, a housing forming at least part of an exterior of the wearable electronic device, a printed circuit board disposed beneath the display, a plurality of electronic components disposed beneath the printed circuit board, a rear cover forming a rear surface of the wearable electronic device, a conductive coil disposed within a specified proximity of the rear cover, a first shielding member comprising a magnetic or metallic sheet or plate disposed between the conductive coil and the plurality of the electronic components, and configured to shield a first area covering the conductive coil, and a second shielding member comprising a magnetic or metallic sheet or plate disposed between the first shielding member and the plurality of the electronic components, and configured to shield at least an area outside of the first area.

According to an example embodiment, the wearable electronic device may further include a shield disposed between the plurality of the electronic components and the second shielding member, wherein the shield may protect the printed circuit board the plurality of the electronic components disposed beneath the printed circuit board.

According to an example embodiment, the first shielding member and the second shielding member may be configured to dually shield an electromagnetic field leaked by the plurality of the electronic components and a metallic component of the shield.

According to an example embodiment, the second shielding member may shield at least a part of an electromagnetic field leaked by the first shielding member.

According to an example embodiment, the conductive coil may generate an electric current based on an electromagnetic field being applied.

According to an example embodiment, the conductive coil may have a spiral shape having a first inside diameter and a second outside diameter greater than the first inside diameter.

According to an example embodiment, the second shielding member may shield an outer area of the second outside diameter.

According to an example embodiment, the second shielding member may shield an inside area of the first inside diameter.

According to an example embodiment, the first shielding member and the second shielding member may be configured to shield an electromagnetic field in a frequency band in a range of about 10 kHz through 300 kHz.

According to an example embodiment, the second shielding member may comprise a magnetic sheet including a magnetic body, and the magnetic body may include at least one of an amorphous ribbon, a nanocrystalline ribbon, a ferrite, and a polymer.

A wearable electronic device (e.g., the electronic device 100 of FIG. 1, the wearable electronic device 300 of FIG. 3) according to an example embodiment may include a housing forming at least part of an exterior of the wearable electronic device, a battery disposed in an inner space formed by the housing, a printed circuit board disposed beneath the battery, a plurality of electronic components disposed beneath the printed circuit board, a rear cover forming a rear surface of the wearable electronic device, a wireless charging coil electrically connected with the battery and disposed within a specified proximity of the rear cover, a first shielding member comprising a magnetic or metallic sheet or plate disposed between the wireless charging coil and the plurality of the electronic components, and configured to shield a first area covering the wireless charging coil, and a second shielding member comprising a magnetic or metallic sheet or plate disposed between the first shielding member and the plurality of the electronic components, and configured to shield a second area which is different from the first area.

According to an example embodiment, the wireless charging coil may generate an electric current based on an electromagnetic field being applied, and the generated current may be introduced to the battery and charges the battery.

According to an example embodiment, the wearable electronic device may further include a shield disposed between the plurality of the electronic components and the second shielding member, wherein the shield may protect the printed circuit board and the plurality of the electronic components disposed beneath the printed circuit board.

According to an example embodiment, the first shielding member and the second shielding member may be configured to dually shield an electromagnetic field leaked by the plurality of the electronic components and a metallic component of the shield.

According to an example embodiment, the second shielding member may shield an electromagnetic field leaked by the first shielding member.

According to an example embodiment, the wireless charging coil may have a spiral shape having a first inside diameter and a second outside diameter greater than the first inside diameter.

According to an example embodiment, the second shielding member may shield at least one of an inside area of the first inside diameter, and an outer area of the second outside diameter.

According to an example embodiment, the second shielding member may include one soft magnetism member comprising a material having soft magnetism or a plurality of soft magnetism members.

According to an example embodiment, the first shielding member and the second shielding member may be configured to shield an electromagnetic field in a frequency band in a range of about 10 kHz through 300 kHz.

According to an example embodiment, the second shielding member may comprise a sheet having soft magnetism including a magnetic body, and the magnetic body may include at least one of an amorphous ribbon, a nanocrystalline ribbon, a ferrite, and a polymer.

According to various embodiments of the disclosure, a second shielding member for shielding at least an outer area of an area shielded by a first shielding member disposed close to (e.g., within a specified proximity of) a wireless charging coil may be added to a wearable electronic device, thus dually shielding an electromagnetic field which is not shielded by the first shielding member but leaked (e.g., metallic loss) by a metallic component.

According to various embodiments of the disclosure, a wearable electronic device including a dual shielding structure with an expanded shielding area may improve its wireless charging efficiency, improve a charging recognition area, and reduce metallic foreign substance misrecognition.

While the disclosure has been illustrated and described with reference to various example embodiments, it will be understood that the various example embodiments are intended to be illustrative, not limiting. It will be further understood by one skilled in the art that various changes in form and detail may be made without departing from the true spirit and full scope of the disclosure, including the appended claims and their equivalents.

What is claimed is:

1. A wearable electronic device comprising:
   a display;
   a housing forming at least part of an exterior of the wearable electronic device;
   a printed circuit board disposed beneath the display;
   a plurality of electronic components disposed on the printed circuit board;
   a rear cover forming at least a part of a rear surface of the wearable electronic device;
   a conductive coil disposed within a specified proximity of the rear cover and configured to wirelessly transmit and receive power for charging;
   a first electromagnetic shield disposed between at least the conductive coil and the plurality of the electronic components, and configured to shield a first area covering the conductive coil; and
   a second electromagnetic shield disposed between at least the first electromagnetic shield and the plurality of the electronic components, and configured to shield at least the first area and an area outside of the first area, wherein an outer diameter of the second electromagnetic shield is greater than an outer diameter of the first electromagnetic field.

2. The wearable electronic device of claim 1, wherein the first electromagnetic shield and the second electromagnetic shield are configured to dually shield an electromagnetic field leaked by the plurality of the electronic components and a metallic component of the shield.

3. The wearable electronic device of claim 2, wherein the second electromagnetic shield is configured to shield an electromagnetic field leaked by the first electromagnetic shield.

4. The wearable electronic device of claim 1, wherein the conductive coil is configured to generate an electric current based on an electromagnetic field being applied.

5. The wearable electronic device of claim 1, wherein the conductive coil has a spiral shape having a first inside diameter and a second outside diameter greater than the first inside diameter.

6. The wearable electronic device of claim 5, wherein the second electromagnetic shield is configured to shield an outer area of the second outside diameter.

7. The wearable electronic device of claim 5, wherein the second electromagnetic shield is configured to shield an inside area of the first inside diameter.

8. The wearable electronic device of claim 1, wherein the first electromagnetic shield and the second electromagnetic shield are configured to shield an electromagnetic field in a frequency band in a range of about 10 kHz through 300 kHz.

9. The wearable electronic device of claim 1, wherein the second electromagnetic shield comprises a magnetic sheet comprising a magnetic body,
   wherein the magnetic body comprises at least one of an amorphous ribbon, a nanocrystalline ribbon, a ferrite, and a polymer.

10. A wearable electronic device comprising:
    a housing forming at least part of an exterior of the wearable electronic device;
    a battery disposed in an inner space formed by the housing;
    a printed circuit board disposed beneath the battery;
    a plurality of electronic components disposed on the printed circuit board;
    a rear cover forming at least a part of a rear surface of the wearable electronic device;
    a wireless charging coil electrically connected with the battery and disposed within a specified proximity of the rear cover and configured to wirelessly transmit and receive power for charging;
    a first electromagnetic shield disposed between at least the wireless charging coil and the plurality of the electronic components, and configured to shield a first area covering the wireless charging coil; and
    a second electromagnetic shield disposed between at least the first electromagnetic shield and the plurality of the electronic components, and configured to shield a second area different from the first area, wherein an outer diameter of the second electromagnetic shield is greater than an outer diameter of the first electromagnetic shield.

11. The wearable electronic device of claim 10, wherein the wireless charging coil is configured to generate an electric current based on an electromagnetic field being applied,
    wherein the generated current is introduced to the battery and charges the battery.

12. The wearable electronic device of claim 10, further comprising:
    a shield disposed between the plurality of the electronic components and the second electromagnetic shield,
    wherein the shield is configured to protect the printed circuit board and the plurality of the electronic components disposed on the printed circuit board.

13. The wearable electronic device of claim 12, wherein the first electromagnetic shield and the second electromagnetic shield are configured to dually shield an electromagnetic field leaked by the plurality of the electronic components and a metallic component of the shield.

14. The wearable electronic device of claim 13, wherein the second electromagnetic shield is configured to shield an electromagnetic field leaked by the first electromagnetic shield.

15. The wearable electronic device of claim 10, wherein the wireless charging coil has a spiral shape having a first inside diameter and a second outside diameter greater than the first inside diameter.

16. The wearable electronic device of claim 15, wherein the second electromagnetic shield is configured to shield at least one of an inside area of the first inside diameter, and an outer area of the second outside diameter.

17. The wearable electronic device of claim 16, wherein the second electromagnetic shield includes one soft magnetism member comprising a material having soft magnetism or a plurality of soft magnetism members.

18. The wearable electronic device of claim 10, wherein the first electromagnetic shield and the second electromagnetic shield are configured to shield an electromagnetic field in a frequency band having a range of about 10 kHz through 300 kHz.

19. The wearable electronic device of claim 10, wherein the second electromagnetic shield includes a sheet having soft magnetism and comprising a magnetic body,
    wherein the magnetic body comprises at least one of an amorphous ribbon, a nanocrystalline ribbon, a ferrite, and a polymer.

* * * * *